(12) United States Patent
Lee et al.

(10) Patent No.: US 11,837,407 B2
(45) Date of Patent: Dec. 5, 2023

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: Geon Yong Lee, Suwon-si (KR); Dong Seuk Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/517,128

(22) Filed: Nov. 2, 2021

(65) Prior Publication Data

US 2022/0262567 A1 Aug. 18, 2022

(30) Foreign Application Priority Data

Feb. 18, 2021 (KR) .......................... 10-2021-0021935

(51) Int. Cl.
| | | |
|---|---|---|
| *H01G 4/01* | (2006.01) | |
| *H01G 4/012* | (2006.01) | |
| *H01G 4/30* | (2006.01) | |
| *H05K 1/18* | (2006.01) | |

(52) U.S. Cl.
CPC .............. *H01G 4/012* (2013.01); *H01G 4/30* (2013.01); *H05K 1/181* (2013.01); *H05K 2201/10015* (2013.01)

(58) Field of Classification Search
CPC ...................................... H01G 4/012

USPC .......................................... 174/260
See application file for complete search history.

(56) References Cited

U.S. PATENT DOCUMENTS

| 8,559,160 B2 * | 10/2013 | Kim ...................... H01G 4/12 |
| | | 361/311 |
| 2013/0107417 A1 | 5/2013 | Cho et al. |
| 2020/0203073 A1 * | 6/2020 | Asano ..................... H01G 4/12 |

FOREIGN PATENT DOCUMENTS

| JP | 2000-040634 A | 2/2000 |
| KR | 10-2013-0047886 A | 5/2013 |

* cited by examiner

*Primary Examiner* — Stanley Tso
(74) *Attorney, Agent, or Firm* — Morgan, Lewis & Bockius LLP

(57) ABSTRACT

A multilayer capacitor includes a capacitor body including first to sixth surfaces, dielectric layers and first and second internal electrodes alternately disposed with the dielectric layer interposed therebetween in a first direction; and first and second external electrodes; wherein the first and second internal electrodes are disposed to be offset in the first direction, wherein a first plurality of the first and second internal electrodes is disposed to be adjacent to the fifth surface in the third direction, a second plurality is disposed to be adjacent to the sixth surface in the third direction, and a third plurality is disposed in a central region in the third direction, and wherein internal electrodes among the first and second internal electrodes, disposed to be adjacent to the surface in the same direction, include an even number of two or more of internal electrodes disposed to be offset therebetween.

18 Claims, 6 Drawing Sheets

MULTILAYER CAPACITOR AND BOARD HAVING THE SAME MOUNTED THEREON

CROSS-REFERENCE TO RELATED APPLICATION(S)

This application claims the benefit of priority to Korean Patent Application No. 10-2021-0021935 filed on Feb. 18, 2021 in the Korean Intellectual Property Office, the disclosure of which is incorporated herein by reference in its entirety.

TECHNICAL FIELD

The present disclosure relates to a multilayer capacitor and a board having the same mounted thereon.

BACKGROUND

A multilayer ceramic capacitor (MLCC) is a passive component and may control an electrical signal in a circuit.

Such a multilayer capacitor may be composed of a ferroelectric material, and when a voltage is applied to both ends of a ferroelectric material, an electrical field may be applied, and accordingly, a multilayer capacitor may expand in a direction parallel to the electrical field and may be induced to reduce in a direction perpendicular to the electrical field. The phenomenon may be known as an electrostrictive phenomenon.

Physical expansion force caused by the electrostrictive phenomenon may be transmitted to a capacitor body such that the force may exceed yield strength of a dielectric in severe cases. In this case, a dielectric component of the capacitor body may be destroyed, and this phenomenon is defined as electrostrictive cracks.

SUMMARY

An aspect of the present disclosure is to provide a multilayer capacitor which may address electrostrictive cracks formed in a capacitor body and a board having the same mounted thereon.

According to an aspect of the present disclosure, a multilayer capacitor includes a capacitor body including first and second surfaces opposing each other in a first direction, third and fourth surfaces opposing each other in a second direction perpendicular to the first direction, and fifth and sixth surfaces opposing each other in a third direction perpendicular to the second direction, a plurality of dielectric layers and a plurality of first and second internal electrodes alternately disposed with the dielectric layer interposed therebetween in the first direction; and first and second external electrodes disposed on the capacitor body and electrically connected to the first and second internal electrodes, respectively; wherein the first and second internal electrodes are disposed to be offset in the first direction, wherein a portion or a first plurality of the first and second internal electrodes is disposed to be adjacent to the fifth surface in the third direction, another portion or a second plurality of the first and second internal electrodes is disposed to be adjacent to the sixth surface in the third direction, and yet another portion or a third plurality of the first and second internal electrodes is disposed in a central region in the third direction, and wherein internal electrodes among the first and second internal electrodes, disposed to be adjacent to the surface in the same direction, include an even number of two or more of internal electrodes disposed to be offset therebetween.

A single first internal electrode and a single second internal electrode, disposed to not be adjacent to the fifth surface, may be disposed between the first internal electrode and the second internal electrode disposed to be adjacent to the fifth surface, a single first internal electrode and a single second internal electrode, disposed to not be adjacent to the sixth surface, may be disposed between the first internal electrode and the second internal electrode disposed to be adjacent to the sixth surface, and wherein a single first internal electrode and a single second internal electrode, disposed to be adjacent to the fifth surface or the sixth surface, may be disposed between the first internal electrode and the second internal electrode disposed in the central region in the third direction.

The first and second internal electrodes may include a 1-1 internal electrode disposed to be adjacent to the fifth surface, a 2-1 internal electrode disposed to be adjacent to the sixth surface, a 1-2 internal electrode disposed in a central region in the third direction, a 2-2 internal electrode disposed to be adjacent to the fifth surface, a 1-3 internal electrode disposed to be adjacent to the sixth surface, and a 2-3 internal electrode disposed in a central region in the third direction. The 1-1 internal electrode, the 2-1 internal electrode, the 1-2 internal electrode, the 2-2 internal electrode, the 1-3 internal electrode, and the 2-3 internal electrode may be laminated in order in the first direction.

The 1-1 internal electrode, the 2-1 internal electrode, the 1-2 internal electrode, the 2-2 internal electrode, the 1-3 internal electrode, and the 2-3 internal electrode may be repeatedly disposed two or more times in the first direction.

A length by which the 1-1 internal electrode and the 2-2 internal electrode are offset toward the fifth surface with reference to the 1-2 internal electrode may be the same as a length by which the 2-1 internal electrode and the 1-3 internal electrode are offset toward the sixth surface with reference to the 1-2 internal electrode.

Lengths of the 1-1 internal electrode and the 2-1 internal electrode which do not overlap each other in the third direction may be the same.

Lengths of the 2-2 internal electrode and the 1-3 internal electrode which do not overlap each other in the third direction may be the same.

Lengths of the 1-2 internal electrode and the 2-3 internal electrode in the third direction may be the same.

The 2-2 internal electrode and the 1-3 internal electrode may work as dampers for forming an electrical field reduction region.

According to an aspect of the present disclosure, a board having a multilayer capacitor mounted thereon includes a board having first and second electrode pads on one surface; and the multilayer capacitor, and first and second external electrodes of the multilayer capacitor may be mounted to be connected to the first and second electrode pads, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
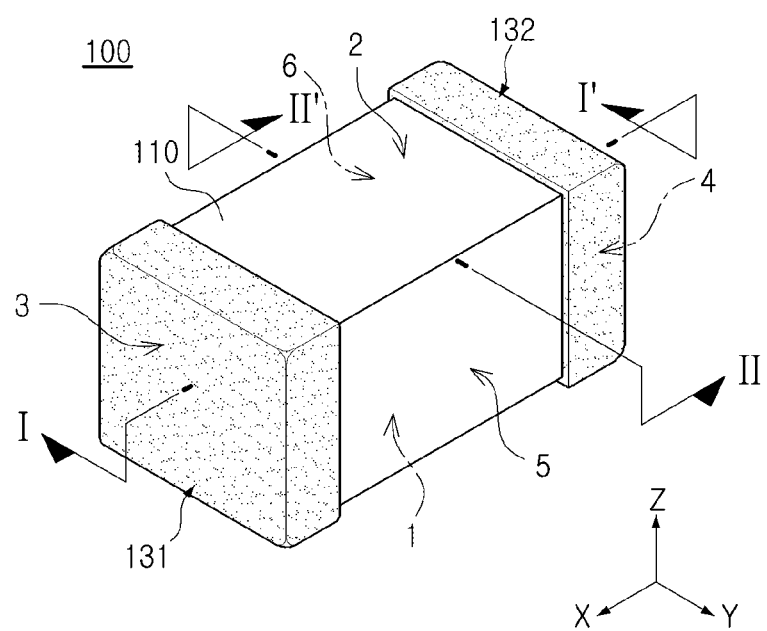
FIG. 1 is a perspective diagram illustrating a multilayer capacitor according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

Shapes and sizes of elements in the drawings may be exaggerated for clarity of description, and elements indicated by the same reference numeral are same elements in the drawings.

Also, it will be understood that when a portion "includes" an element, it may further include another element, not excluding another element, unless otherwise indicated.

In this specification, that a member is disposed "on" a certain component includes not only the case where the member is disposed in direct contact with the component, but also the case where another component is disposed between the component and the member.

In the present specification, expressions such as "A or B", "at least one of A or/and B", "one or more of A or/and B", or the like may include all possible combinations items listed together. For example, "A or B", "at least one of A and B", or "at least one of A or B" may refer to include cases of (1) at least one A, (2) at least one B, or (3) both including at least one A and at least one B.

As for a direction of the capacitor body 110, X, Y, and Z in the drawings represent a length direction, a width direction, and a thickness direction of the capacitor body 110, respectively.

The Z direction may be the same direction as a lamination direction in which dielectric layers are laminated.

Also, both surfaces of the capacitor body 110 opposing each other in the Z direction may be defined as first and second surfaces 1 and 2, and both surfaces connected to the first and second surfaces 1 and 2 and opposing each other in the X direction may be defined as third and fourth surfaces 3 and 4, and both surfaces connected to the first and second surfaces 1 and 2 and the third and fourth surfaces 3 and 4 and opposing each other in the Y direction may be defined as fifth and sixth surfaces 5 and 6.

Amounting surface of the multilayer capacitor 100 may be the first surface 1 of the capacitor body 110.

Figure 2:
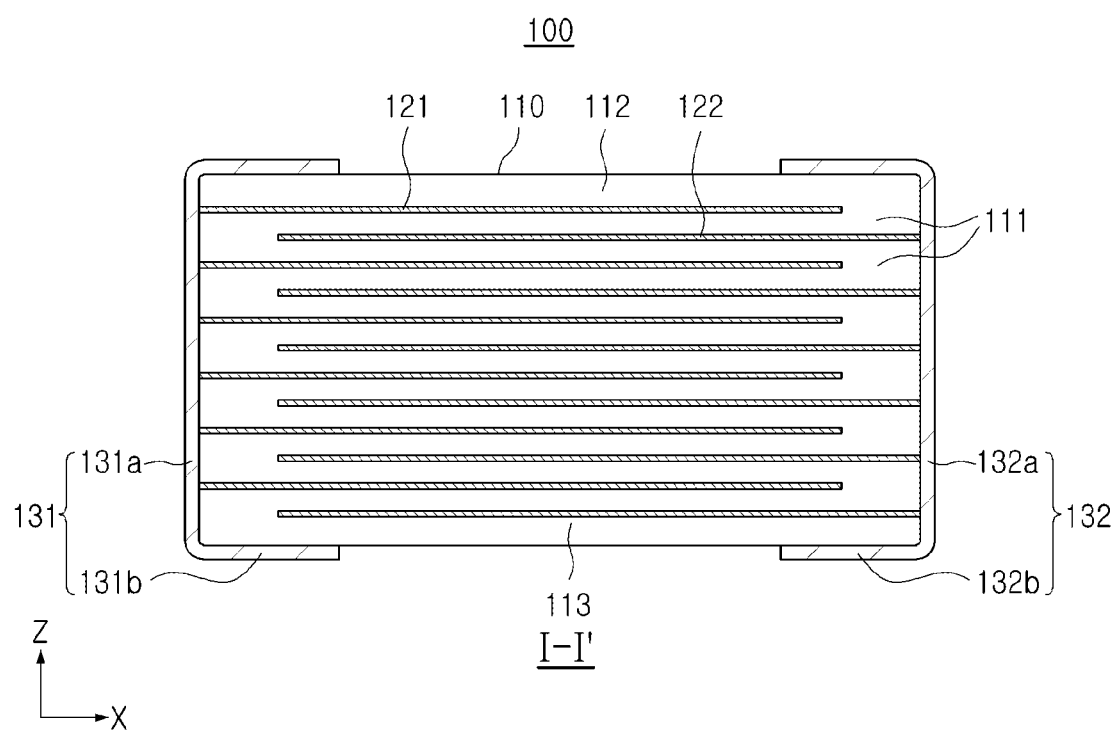
FIG. 2 is a cross-sectional diagram taken along line I-I' in FIG. 1.
Figure 3:
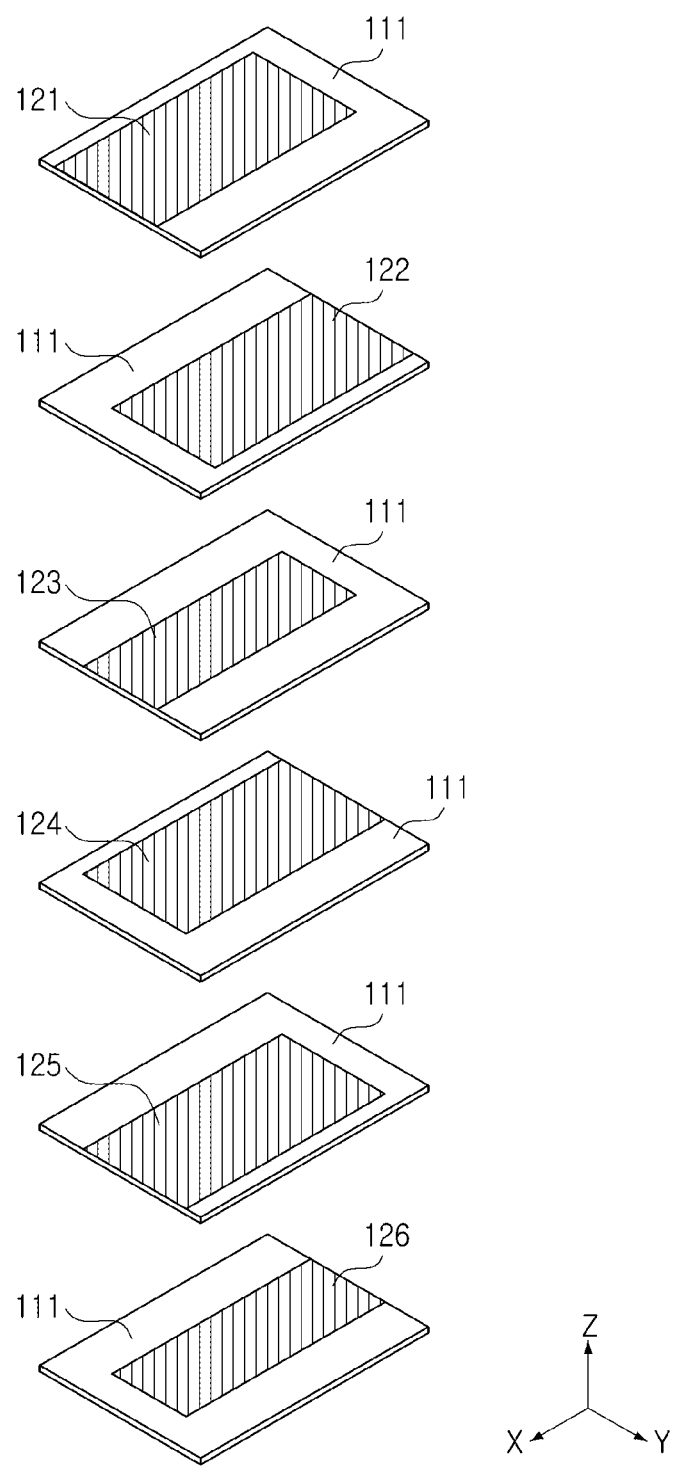
FIG. 3 is an exploded perspective diagram illustrating a laminate structure of a first internal electrode and a second internal electrode in FIG. 1.
Figure 4:
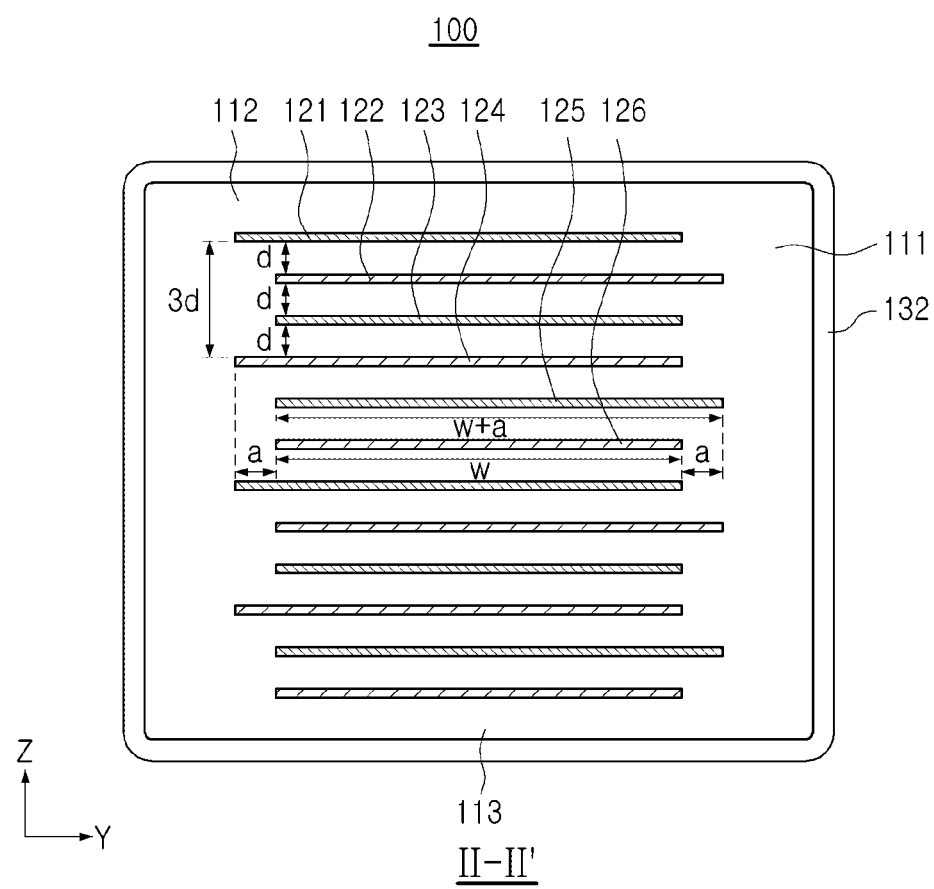
FIG. 4 is a cross-sectional diagram taken along line II-II' in FIG. 1.

FIG. 1 is a perspective diagram illustrating a multilayer capacitor according to an example embodiment. FIG. 2 is a cross-sectional diagram taken along line I-I' in FIG. 1. FIG. 3 is an exploded perspective diagram illustrating a lamination structure of a first internal electrode and a second internal electrode in FIG. 1. FIG. 4 is a cross-sectional diagram taken along line II-II' in FIG. 1.

Referring to FIGS. 1 to 4, a multilayer capacitor 100 in the example embodiment may include a capacitor body 110 and first and second external electrodes 131 and 132.

The capacitor body 101 may include a plurality of dielectric layers 111 and a plurality of first and second internal electrodes 121 and 122 alternately disposed with the dielectric layers 111 interposed therebetween.

The capacitor body 110 may be obtained by laminating the plurality of dielectric layers 111 in the Z direction and baking the dielectric layers, and boundaries between the dielectric layers 111 of the capacitor body 110 adjacent to each other may be integrated such that it may be difficult to identify the boundaries without using a scanning electron microscope (SEM).

The capacitor body 110 may have a substantially hexahedral shape, but an example embodiment thereof is not limited thereto. Also, the shape and dimensions of the capacitor body 110 and the number of laminated dielectric layers 111 are not limited to the examples illustrated in the drawings.

The dielectric layers 111 may include a high-k ceramic material, barium titanate ($BaTiO_3$) or strontium titanate ($SrTiO_3$) ceramic powder, for example, but an example embodiment thereof is not limited thereto as long as sufficient capacitance is able to be obtained.

The dielectric layers 111 may further include ceramic additives, organic solvents, plasticizers, binders, and dispersants in addition to ceramic powder.

As the ceramic additives, a transition metal oxide or a transition metal carbide, a rare earth element, magnesium (Mg) or aluminum (Al) may be used.

The capacitor body 110 may include an active region contributing to the formation of capacitance of the capacitor, and upper and lower covers 112 and 113 disposed above and below the active region in the Z direction as upper and lower margin portions.

The upper and lower covers 112 and 113 may have a material and a configuration the same as those of the dielectric layers 111 other than the configuration in which the upper and lower covers do not include internal electrodes.

The upper and lower covers 112 and 113 may be disposed by laminating a single dielectric layer or two or more dielectric layers on upper and lower surfaces of the active region in the Z direction, respectively, and may prevent damages to the first and second internal electrodes 121 and 122 caused by physical or chemical stress.

The first and second internal electrodes 121 and 122 may be applied with different polarities, and may be alternately disposed in the Z direction with the dielectric layer 111 interposed therebetween, and one ends thereof may be exposed to the third and fourth surfaces 3 and 4 of the capacitor body 110, respectively.

In this case, the first and second internal electrodes 121 and 122 may be electrically insulated from each other by the dielectric layer 111 disposed therebetween.

Accordingly, the ends of the first and second internal electrodes 121 and 122, alternately exposed through the third and fourth surfaces 3 and 4 of the capacitor body 110, may be electrically connected to the first and second external electrodes 131 and 132 disposed on the third and fourth surfaces 3 and 4 of the capacitor body 110, respectively.

By the above configuration, when a predetermined voltage is applied to the first and second external electrodes 131 and 132, electrical charges may be accumulated between the first and second internal electrodes 121 and 122.

In this case, capacitance of the multilayer capacitor 100 may be proportional to a region of overlap between the first and second internal electrodes 121 and 122, overlapping each other in the Z direction in the active region.

A material for forming the first and second internal electrodes 121 and 122 is not limited to any particular material, and the first and second internal electrodes 121 and 122 may be formed using a conductive paste formed of or including a noble metal material such as platinum (Pt), palladium (Pd), palladium-silver (Pd—Ag) alloy, and at least one of nickel (Ni) and copper (Cu).

In this case, as the method of printing the conductive paste, a screen-printing method or a gravure printing method may be used, and an example embodiment thereof is not limited thereto.

In the example embodiment, as for the first and second internal electrodes, adjacent first and second internal electrodes may be disposed to be offset in the Z direction, a lamination direction.

In this case, when viewed from the Y-Z cross-sectional surface of the capacitor body 110, a portion or a first plurality of the first and second internal electrodes may be disposed to be adjacent to the fifth surface in the Y direction, another portion or a second plurality of the first and second electrodes may be disposed to be adjacent to the sixth surface in the Y direction, and yet another portion or a third plurality of the first and second electrodes may be disposed in a central region in the Y direction. Internal electrodes among the first and second internal electrodes, disposed to be adjacent to the surfaces in the same direction may include an even number of two or more of internal electrodes disposed to be offset therebetween.

In the example embodiment, the first and second internal electrodes may include a 1-1 internal electrode 121, a 2-1 internal electrode 122, a 1-2 internal electrode 123, a 2-2 internal electrode 124, a 1-3 internal electrode 125, and a 2-3 internal electrode 126, laminated in order from an upper portion to a lower portion in the Z direction.

In an example embodiment, a single first internal electrode and a single second internal electrode, disposed to not be adjacent to the fifth surface, may be disposed between the first internal electrode and the second internal electrode disposed to be adjacent to the fifth surface, a single first internal electrode and a single second internal electrode, disposed to not be adjacent to the sixth surface, may be disposed between the first internal electrode and the second internal electrode disposed to be adjacent to the sixth surface, and a single first internal electrode and a single second internal electrode, disposed to be adjacent to the fifth surface or the sixth surface, may be disposed between the first internal electrode and the second internal electrode disposed in the central region in the Y direction.

In the example embodiment, the first and second internal electrodes may include a 1-1 internal electrode 121, a 2-1 internal electrode, a 1-2 internal electrode 123, a 2-2 internal electrode 124, a 1-3 internal electrode 125, and a 2-3 internal electrode 126, laminated in order from an upper portion to a lower portion of the capacitor body 110 in the Z direction.

The 1-1 internal electrode 121 may be disposed to be adjacent to the fifth surface 5 in the Y direction, the 2-1 internal electrode 122 may be disposed to be adjacent to the sixth surface 6 in the Y direction, the 1-2 internal electrode 123 may be disposed in a central region in the Y direction, the 2-2 internal electrode 124 may be disposed to be adjacent to the fifth surface 5 in the Y direction, the 1-3 internal electrode 125 may be disposed to be adjacent to the sixth surface 6 in the Y direction, and the 2-3 internal electrode 126 disposed in the central region in the Y direction. In other words, in the example embodiment, both of the 1-1 internal electrode 121 and the 2-2 internal electrode 124 may be disposed to be adjacent to the same surface (surface 5 or surface 6) in the Y direction. Similarly, both of the 2-1 internal electrode 122 and the 1-3 internal electrode 125 may be disposed to be adjacent to the same surface (surface 6 or surface 5) in the Y direction, this surface is opposite the surface to which both the 1-1 internal electrode 121 and the 2-2 internal electrode 124 are adjacent. Further, both of the 1-2 internal electrode 123 and the 2-3 internal electrode 126 may be disposed in the central region in the Y direction.

The 1-1 internal electrode 121, the 2-1 internal electrode 122, the 1-2 internal electrode 123, the 2-2 internal electrode 124, the 1-3 internal electrode 125, and the 2-3 internal electrode 126 may be repeatedly disposed two or more times in the Z direction.

A length 'a' by which the 1-1 internal electrode 121 and the 2-2 internal electrode 124 are offset toward the fifth surface 5 with reference to the 1-2 internal electrode 123 may be the same as a length 'a' by which the 2-1 internal electrode 122 and the 1-3 internal electrode 125 are offset toward the sixth surface 6 with reference to the 1-2 internal electrode 123.

Also, lengths of the 1-1 internal electrode 121 and the 2-1 internal electrode 122 not overlapping each other in the Y direction may be configured to be the same, and lengths of the 2-2 internal electrode 124 and the 1-3 internal electrode 125 not overlapping each other in the Y direction may be configured to be the same.

Lengths of the 1-2 internal electrode 123 and the 2-3 internal electrode 126 in the Y direction may be configured to be the same.

By including this structure, the 2-2 internal electrode 124 and the 1-3 internal electrode 125 may work as a damper for forming an electrical field reduction region.

The first and second external electrodes 131 and 132 may be provided with voltages of different polarities, may be disposed on the third and fourth surfaces 3 and 4 of the capacitor body 110, and may be electrically connected to the exposed portions of the first and second internal electrodes 121 and 122 in the capacitor body 110, respectively.

In this case, the first and second external electrodes 131 and 132 may include conductive layers disposed on the third and fourth surfaces 3 and 4 of the capacitor body 110, and plating layers disposed on the conductive layers.

The plating layer may include a nickel (Ni) plated layer disposed on the conductive layer and a tin (Sn) plated layer disposed on the nickel (Ni) plated layer.

The first external electrode 131 may include a first connection portion 131*a* and a first band portion 131*b*.

The first connection portion 131*a* may be disposed on the third surface 3 of the capacitor body 110 and may be connected to an exposed portion of the first internal electrode 121, and the first band portion 131*b* may extend from the first connection portion 131*a* to a portion of the first surface 1 of the capacitor body 110.

In this case, the first band portion 131*b* may further extend to a portion of the fifth and sixth surfaces 5 and 6 of the capacitor body 110 and a portion of the second surface 2 so as to improve adhesion strength.

The second external electrode 132 may include a second connection portion 132*a* and a second band portion 132*b*.

The second connection portion 132a may be disposed on the fourth surface 4 of the capacitor body 110 and may be connected to an exposed portion of the second internal electrode 122, and the second band portion 132b may extend from the second connection portion 132a to a portion of the first surface 1 of the capacitor body 110.

In this case, the second band portion 132b may further extend to a portion of the fifth and sixth surfaces 5 and 6 of the capacitor body 110 and a portion of the second surface 2 so as to improve adhesion strength.

In a general multilayer capacitor, when the electrostrictive phenomenon is induced, the most vulnerable portion may be a boundary region between the margin portion in the Y direction and the active region in which the internal electrodes overlap vertically. The reasons are as follows.

An electrical field is not present in the margin portion, and electrical field may be present in the active region in which the internal electrodes overlap vertically, such that, due to the difference, expansion of the dielectric layer may be induced, and in this case, strong stress may occur in a boundary between an expanded portion and a non-expanded portion of the capacitor body.

Also, the margin portion in Y-direction in the capacitor body may have the lowest density in terms of a process of manufacturing the multilayer capacitor, and an empty space dependent on a thickness of a printed layer may be present unless a method of separately forming a margin is used.

In the process of compressing the laminate, a change in the shape of the chip may be induced to fill the empty space. However, it may be impossible to completely fill the empty space without any defects using currently used techniques.

For the reasons as above, it is expected that the boundary region between the margin portion in the Y-direction and the active region in the capacitor body may be most vulnerable to electrostrictive phenomenon, and when BDV measurement is performed, chip breakage caused by electrostrictive cracks may mostly occur in the boundary region between the margin portion in the Y-direction and the active region in which the internal electrodes overlap vertically.

In the example embodiment, to reduce the electrostrictive breakage in the boundary between the margin portion in the Y-direction and the active region of the capacitor body, a sudden difference in the boundary between the margin portion in the Y-direction and the active region in which the internal electrodes overlap in the Z direction may be controlled.

To this end, as illustrated in FIGS. 3 and 4, the first and second internal electrodes having different lengths in the Y direction may be disposed to be offset in the Y direction in the capacitor body 110.

Referring to FIGS. 3 and 4, in the capacitor body 110 in the example embodiment, the first and second internal electrodes having two different lengths 'w' and 'w+a' may be laminated by odd multiples to intersect each other.

In FIG. 4, the capacitor body may be divided into a portion in which the first and second internal electrodes overlap in the Z direction, a portion in which the first and second internal electrodes are offset in the Y direction and intersect each other, and a margin portion in the Y direction.

A distance between the first and second internal electrodes adjacent to each other in the Z direction may be defined as 'd', a length at which the first and second internal electrodes overlap each other in the Y direction may be defined as 'w', a length at which the first and second internal electrodes are offset in the Y direction and do not overlap may be defined as 'a', a voltage applied to the first and second internal electrodes may be defined as 'v', and an electrical field may be defined as E. $E=v/d$ may be satisfied.

In this case, an electrical field may be generated in the active region in which the internal electrodes adjacent to each other in the Z direction overlap, but an electrical field may not be generated in the margin portion in which the internal electrodes do not overlap each other.

Figure 6:
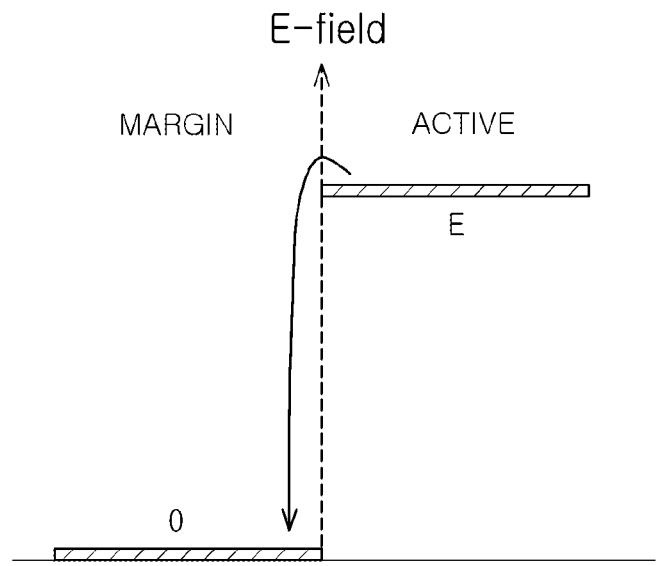
FIG. 6 is a diagram illustrating changes in an electrical field between an active region and a margin portion taken in a Y direction in a general multilayer capacitor without an offset arrangement.

The electrical field E corresponding to d may be generated in the active region and the electrical field may be 0 in the margin portion. A general structure in which the first and second internal electrodes laminated in the Z direction overlap each other without being offset as in FIG. 6 is included, an electrical field of magnitude E may be generated in the active region between the internal electrodes, and the electrical field may become 0 in the margin portion, such that a sudden decrease in the electrical field may be applied to the boundary between the active region and the margin region, and may increase the possibility of cracks in the portion.

Figure 7:
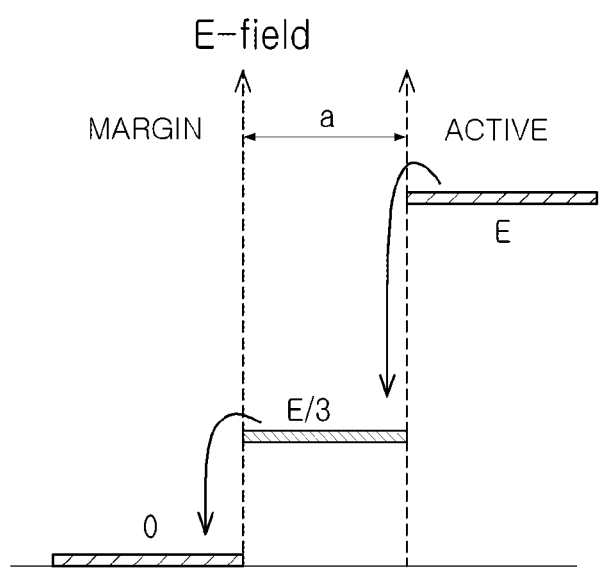
FIG. 7 is a diagram illustrating changes in an electrical field between an active region and a margin portion taken in a Y direction in a multilayer capacitor according to an example embodiment of the present disclosure.

However, as illustrated in FIG. 7, in the example embodiment, internal electrodes disposed to be adjacent to the left and right margin portions in the Y direction by the offset structure of the internal electrodes on the boundary between the active region and the margin portion may be present, and in this region, the internal electrodes oppose each other in the Z direction may have a distance 3d therebetween, and accordingly, a magnitude of electrical field (E-field) of the portion having the distance 3d may be reduced to E/3 as compared to that of the active region.

In the example embodiment, the 2-2 internal electrode 124 and the 1-3 internal electrode 125 may work as dampers for reducing the magnitude of such an electrical field, such that the electrical field reduced to E/3 may reduce a sudden difference in electrical field density at the boundary between the active region and the margin portion.

Accordingly, the sudden decrease in the electrical field from the active region to the margin portion may not be immediately applied, but a portion (electrical field reduction region) applied in E/3 may be formed in the center by the length of a, such that cracks formed at the boundary between the active region and the margin portion may be reduced.

In this case, to observe the Y-Z surface of the capacitor body 110, the capacitor body 110 may be ground to a depth of about ½ in the X direction, thereby exposing the Y-Z cross-sectional surface of the capacitor body 110.

Also, the offset level of the internal electrode exposed on the Y-Z cross-sectional surface of the capacitor body 110 may be confirmed using an optical microscope or a scanning electron microscope (SEM).

Figure 5:
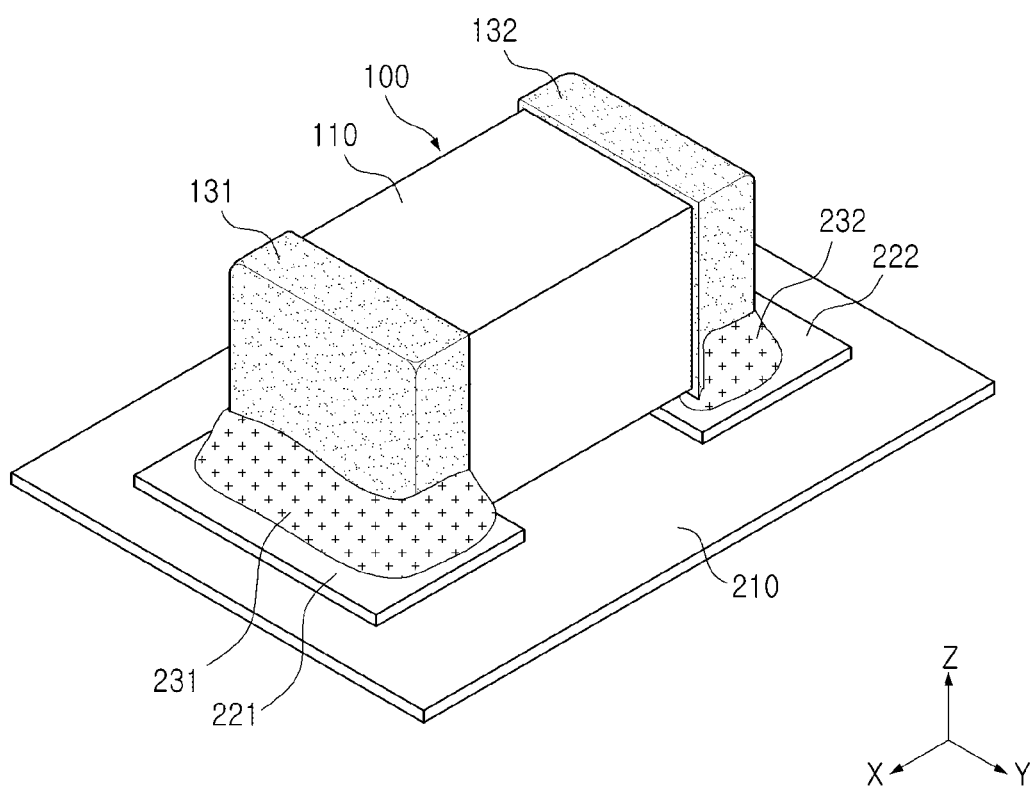
FIG. 5 is a perspective diagram illustrating an example in which a multilayer capacitor is mounted on a board.

FIG. 5 is a perspective diagram illustrating an example in which a multilayer capacitor is mounted on a board.

Referring to FIG. 5, the board on which the multilayer capacitor is mounted in the example embodiment may include a board 210 on which the multilayer capacitor 100 is mounted, and first and second electrode pads 221 and 222 configured to be spaced apart from each other on an upper surface of the board 210.

In the multilayer capacitor 100, the first and second band portions 131b and 132b of the first and second external electrodes 131 and 132 may be mounted on and connected to the first and second electrode pads 221 and 222, and may be electrically connected to the board 210 by solders 231 and 232.

According to the aforementioned example embodiment, electrostrictive cracks formed in the capacitor body caused by an electrostrictive phenomenon may be reduced.

While the example embodiments have been illustrated and described above, it will be apparent to those skilled in the art that modifications and variations could be made without departing from the scope in the example embodiment as defined by the appended claims.

What is claimed is:

1. A multilayer capacitor, comprising:
a capacitor body including first and second surfaces opposing each other in a first direction, third and fourth surfaces opposing each other in a second direction perpendicular to the first direction, and fifth and sixth surfaces opposing each other in a third direction perpendicular to the second direction, a plurality of dielectric layers and a plurality of first and second internal electrodes alternately disposed with respective dielectric layers interposed therebetween in the first direction; and
first and second external electrodes disposed on the capacitor body and electrically connected to the first and second internal electrodes, respectively;
wherein the first and second internal electrodes are disposed to be offset in the first direction,
wherein a first plurality of the first and second internal electrodes is disposed to be closer to the fifth surface than the sixth surface in the third direction, a second plurality of the first and second internal electrodes is disposed to be closer to the sixth surface than the fifth surface in the third direction, and a third plurality of the first and second internal electrodes is disposed in a central region in the third direction,
wherein internal electrodes among the first and second internal electrodes, disposed to be closer to the fifth or sixth surface in the third direction, include an even number of another two or more internal electrodes disposed therebetween in the first direction and offset therefrom in the third direction, and
wherein the even number of another two or more internal electrodes includes at least one first internal electrode and at least one second internal electrode.

2. The multilayer capacitor of claim 1,
wherein a single first internal electrode and a single second internal electrode, disposed to not be closest to the fifth surface among the first and second internal electrodes, are disposed between the first internal electrode and the second internal electrode disposed to be closer to the fifth surface than the sixth surface in the third direction,
wherein a single first internal electrode and a single second internal electrode, disposed to not be closest to the sixth surface among the first and second internal electrodes, are disposed between the first internal electrode and the second internal electrode disposed to be closer to the sixth surface than the fifth surface in the third direction, and
wherein a single first internal electrode and a single second internal electrode, disposed to be closer to the fifth surface or the sixth surface, are disposed between the first internal electrode and the second internal electrode disposed in the central region in the third direction.

3. The multilayer capacitor of claim 1,
wherein the first and second internal electrodes include a 1-1 internal electrode disposed to be closer to the fifth surface than the sixth surface in the third direction, a 2-1 internal electrode disposed to be closer to the sixth surface than the fifth surface in the third direction, a 1-2 internal electrode disposed in a central region in the third direction, a 2-2 internal electrode disposed to be closer to the fifth surface than the sixth surface in the third direction, a 1-3 internal electrode disposed to be closer to the sixth surface than the fifth surface in the third direction, and a 2-3 internal electrode disposed in a central region in the third direction, and
wherein the 1-1 internal electrode, the 2-1 internal electrode, the 1-2 internal electrode, the 2-2 internal electrode, the 1-3 internal electrode, and the 2-3 internal electrode are laminated in order in the first direction.

4. The multilayer capacitor of claim 3, wherein the 1-1 internal electrode, the 2-1 internal electrode, the 1-2 internal electrode, the 2-2 internal electrode, the 1-3 internal electrode, and the 2-3 internal electrode are repeatedly disposed two or more times in the first direction.

5. The multilayer capacitor of claim 3, wherein a length by which the 1-1 internal electrode and the 2-2 internal electrode are offset toward the fifth surface with reference to the 1-2 internal electrode is the same as a length by which the 2-1 internal electrode and the 1-3 internal electrode are offset toward the sixth surface with reference to the 1-2 internal electrode.

6. The multilayer capacitor of claim 3, wherein lengths of the 1-1 internal electrode and the 2-1 internal electrode which do not overlap each other in the third direction are the same.

7. The multilayer capacitor of claim 3, wherein lengths of the 2-2 internal electrode and the 1-3 internal electrode which do not overlap each other in the third direction are the same.

8. The multilayer capacitor of claim 3, wherein lengths of the 1-2 internal electrode and the 2-3 internal electrode in the third direction are the same.

9. The multilayer capacitor of claim 3, wherein the 2-2 internal electrode and the 1-3 internal electrode work as dampers for forming an electrical field reduction region.

10. A board having a multilayer capacitor mounted thereon, the board comprising:
a board having first and second electrode pads on one surface; and
the multilayer capacitor of claim 1,
wherein first and second external electrodes of the multilayer capacitor are mounted to be connected to the first and second electrode pads, respectively.

11. The board of claim 10, with respect to the multilayer capacitor,
wherein a single first internal electrode and a single second internal electrode, disposed to not be closest to the fifth surface among the first and second internal electrodes, are disposed between the first internal electrode and the second internal electrode disposed to be closer to the fifth surface than the sixth surface in the third direction,
wherein a single first internal electrode and a single second internal electrode, disposed to not be closest to the sixth surface among the first and second internal electrodes, are disposed between the first internal electrode and the second internal electrode disposed to be closer to the sixth surface than the fifth surface in the third direction, and
wherein a single first internal electrode and a single second internal electrode, disposed to be closer to the fifth surface or the sixth surface, are disposed between the first internal electrode and the second internal electrode disposed in the central region in the third direction.

12. The board of claim 10, with respect to the multilayer capacitor,
wherein the first and second internal electrodes include a 1-1 internal electrode disposed to be closer to the fifth surface than the sixth surface in the third direction, a 2-1 internal electrode disposed to be closer to the sixth surface than the fifth surface in the third direction, a 1-2 internal electrode disposed in a central region in the third direction, a 2-2 internal electrode disposed to be closer to the fifth surface than the sixth surface in the third direction, a 1-3 internal electrode disposed to be closer to the sixth surface than the fifth surface in the third direction, and a 2-3 internal electrode disposed in a central region in the third direction, and
wherein the 1-1 internal electrode, the 2-1 internal electrode, the 1-2 internal electrode, the 2-2 internal electrode, the 1-3 internal electrode, and the 2-3 internal electrode are laminated in order in the first direction.

13. The board of claim 12, wherein the 1-1 internal electrode, the 2-1 internal electrode, the 1-2 internal electrode, the 2-2 internal electrode, the 1-3 internal electrode, and the 2-3 internal electrode are repeatedly disposed two or more times in the first direction.

14. The board of claim 12, wherein a length by which the 1-1 internal electrode and the 2-2 internal electrode are offset toward the fifth surface with reference to the 1-2 internal electrode is the same as a length by which the 2-1 internal electrode and the 1-3 internal electrode are offset toward the sixth surface with reference to the 1-2 internal electrode.

15. The board of claim 12, wherein lengths of the 1-1 internal electrode and the 2-1 internal electrode which do not overlap each other in the third direction are the same.

16. The board of claim 12, wherein lengths of the 2-2 internal electrode and the 1-3 internal electrode which do not overlap each other in the third direction are the same.

17. The board of claim 12, wherein lengths of the 1-2 internal electrode and the 2-3 internal electrode in the third direction are the same.

18. The board of claim 12, wherein the 2-2 internal electrode and the 1-3 internal electrode work as dampers for forming an electrical field reduction region.

* * * * *